Figure 1:
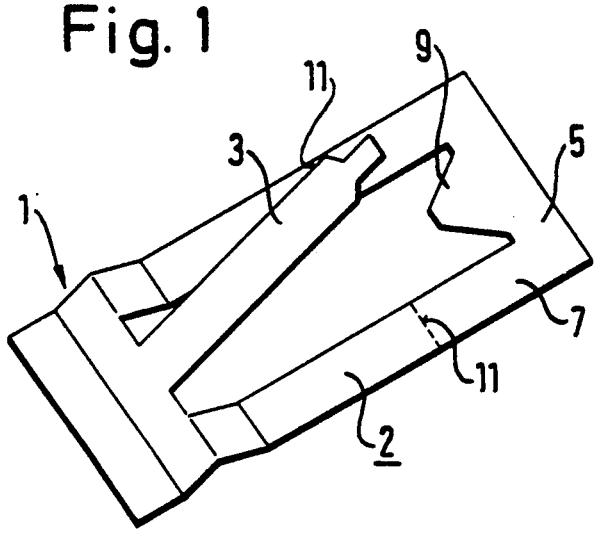

United States Patent [19]

Fischer

[11] Patent Number: 5,280,262
[45] Date of Patent: Jan. 18, 1994

[54] THERMAL OVERLAOD FUSE OF SURFACE MOUNT COMPATIBLE CONSTRUCTION

[75] Inventor: Kurt Fischer, Altdorf, Fed. Rep. of Germany

[73] Assignee: Roederstein Spezialfabriken fur Bauelemente der Elektronik und Kondensatoren der Starkstromtechnik GmbH, Landshut, Fed. Rep. of Germany

[21] Appl. No.: 33,841

[22] Filed: Mar. 19, 1993

[30] Foreign Application Priority Data

Mar. 24, 1992 [DE] Fed. Rep. of Germany ....... 4209542

[51] Int. Cl.$^5$ ........................................... H01H 37/76
[52] U.S. Cl. ................................. 337/405; 337/402; 337/407
[58] Field of Search ............... 337/405, 402, 401, 403, 337/404, 406, 407, 413, 414, 415

[56] References Cited

U.S. PATENT DOCUMENTS 2,704,797  3/1955  Pettweis ............................. 337/405
2,790,049  4/1957  McAlister ........................... 337/405
4,433,231  2/1984  Balchunas ........................... 337/405

FOREIGN PATENT DOCUMENTS 3825897  1/1990  Fed. Rep. of Germany .

Primary Examiner—Harold Broome
Attorney, Agent, or Firm—Merchant & Gould, Smith, Edell, Welter & Schmidt

[57] ABSTRACT

A thermal overload fuse (1) for fixation to a circuit substrate (17) comprising at least one spring arm (13) which is solderable, under fixed pre-stressed, to a contact location on the substrate, characterized in that the spring arm (13), which is fixed to an at least substantially planar frame part (2), adopts, in its relaxed state, a position which is spaced in a perpendicular direction relative to the substrate (17), in particular relative to the contact location (16); and in that the free end of the spring arm (13) is held down by at least one auxiliary web (7) onto the substrate (17), in particular onto the contact location (16); and in that the auxiliary web (7) is detachable from the frame part (2) along a predetermined line.

13 Claims, 3 Drawing Sheets

THERMAL OVERLAOD FUSE OF SURFACE MOUNT COMPATIBLE CONSTRUCTION

The invention relates to a thermal overload fuse for fixation to a substrate circuit comprising at least one spring arm which is solderable, under fixed pre-stress and with the aid of reflow soldering, to a contact location of the substrate.

A fuse of this kind is known from the pending German patent application DE-OS 38 25 897. A melt fuse is described in this document which consists of a U-shaped bow, the limbs of which forms the spring arms. The spring arms are pre-spread by a supporting arrangement made from a plastically deformable part of the melt fuse. After soldering of the melt fuse on the substrate, the parts forming the supporting arrangement are bent away, thereby removing the supportive effect.

The object of the invention is to construct a thermal overload fuse of the above named kind, so that it is particularly simple and cheap to manufacture and can be soldered onto the substrate using the reflow soldering process.

The object is satisfied in accordance with the invention by a thermal fuse of the initially named kind which is characterised in that the spring arm, which is fixed to an at least substantially planar frame part, adopts, in its relaxed state, a position which is spaced in a perpendicular direction relative to the substrate, in particular relative to the contact location; and in that the free end of the spring arm is held down by at least one auxiliary web onto the substrate, in particular onto the contact location; and in that the auxiliary web is detachable from the frame part along a predetermined line.

In accordance with a useful embodiment of the invention, the thermal overload fuse is constructed as a frame part, in particular as a rectangular frame part with a free-lying central tongue. In the region of the shank of the central tongue the frame part is kinked in a knee-like fashion so that the central tongue in its relaxed state points obliquely upward, thereby forming the spring arm. The knee-like kink extends therein preferably perpendicular to the longitudinal axis of the spring arm. The frame part surrounding the spring arm lies substantially in a single plane. Areal contact locations are thereby realised by bringing the thermal overload fuse onto a substrate circuit, these contact locations providing a good connection and solderability to the substrate.

In accordance with a further embodiment, the auxiliary web holding down the spring arm is arranged on the side of the frame piece facing towards the free end of the spring arm. The auxiliary web is preferentially formed from the end part of the frame part which faces towards the free end of the spring arm. It is however also conceivable to construct the auxiliary web as a separate part which, for instance, could be plugged onto the frame part.

In accordance with a further embodiment, the end part of the frame part facing towards the free end of the spring arm is bent upward and comprises a support pointing towards the spring arm. This holds the free end of the spring arm down so that this end is arranged in the plane of the frame.

The support can be constructed by bending the upwardly bent end part downward, wherein the downwardly bent part can point either in the direction of the spring arm's free end or shank.

In accordance with a further embodiment, the upwardly bent end piece includes a tongue-shaped part, which is bent towards the spring arm, thereby forming the support for the holding down of the spring arm.

In accordance with a further advantageous embodiment, the end part of the frame part facing towards the free end of the spring arm is bent round so that it holds down the free end of the spring arm in such a way, that this end is arranged in the plane of the frame. This is achieved by completely bending the end part round, i.e. bending it around by approximately 180°.

In accordance with a further preferred embodiment, the auxiliary web is connected to the thermal overload fuse via a notch line to aid breaking off of the auxiliary web. By simple waggling the auxiliary web to and fro along the notch line, the auxiliary web can be separated from the thermal overload fuse after soldering of same, in order to achieve the intended function (i.e. activate the fuse).

In accordance with a further useful embodiment, those parts of the thermal overload fuse which are not to be bent on kinked, are provided with stiffening elements, in particular with stiffening grooves having an embossed form. Thereby, the spring action of the spring arm is strengthened and a co-planarity of the solder surfaces effected, which ensures the reflow solderability of the component.

The frame part, the spring arm and the auxiliary web are preferably constructed as a unitary stamp or pressed part, whereby a particularly simple and inexpensive manufacturing process is achieved. Furthermore, it is advantageous to manufacture the thermal overload fuse from spring bronze, in particular from galvanically nickelled and tinned spring bronze.

Further particularly advantageous features of the invention are set forth in the subordinate claims.

The advantage of the thermal overload switch constructed in accordance with the invention lies, on the one hand, in the particularly simple and cheap manufacture and, on the other hand, in that a particularly industrially convenient assembly is ensured by means of reflow soldering which is made possible by the areal layout of the thermal overload fuse on the substrate circuit.

Figure 2:
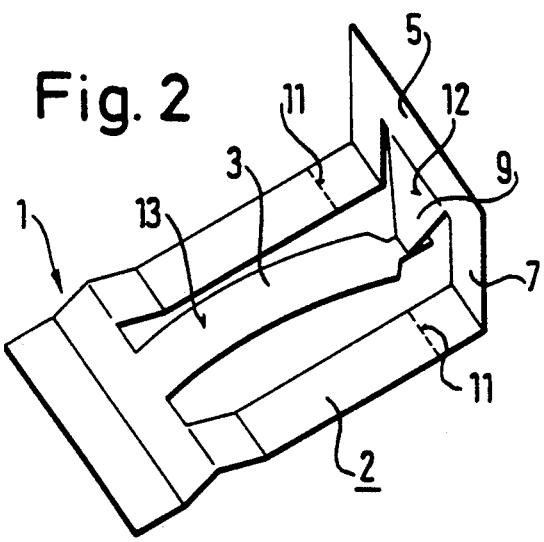
Figure 3:
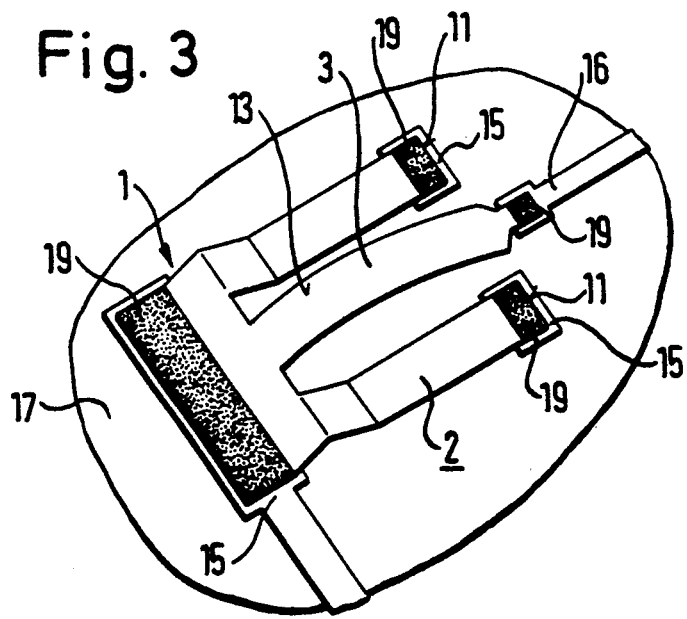
Figure 4:
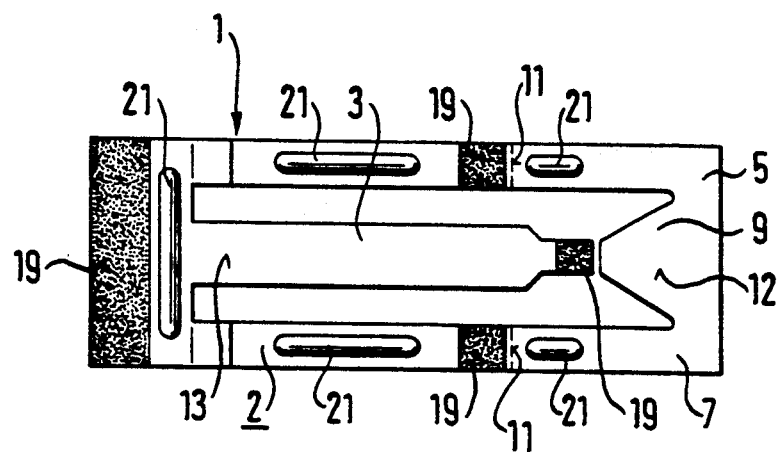
Figure 5:
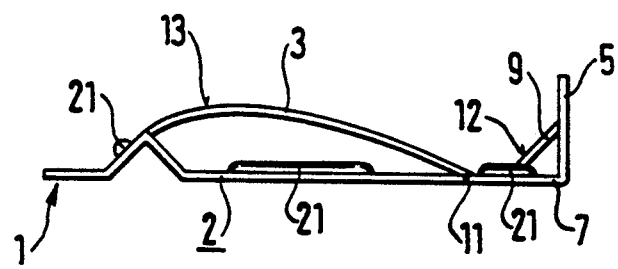
Figure 6:
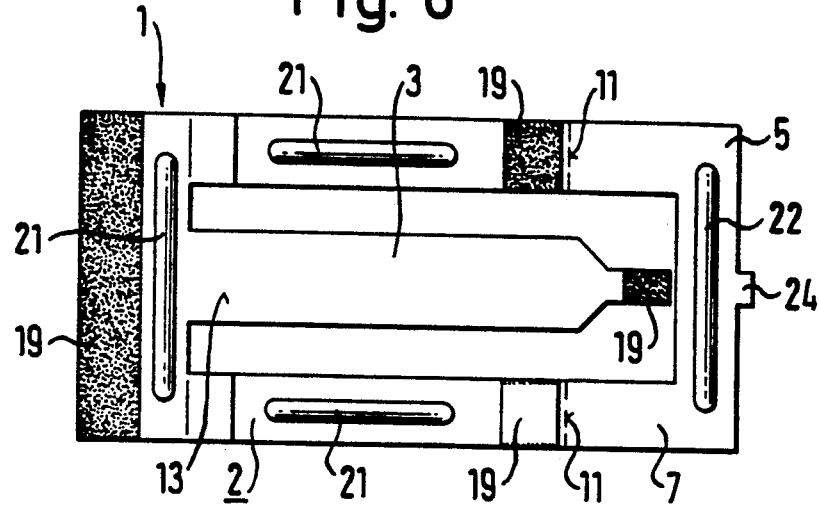
Figure 7:
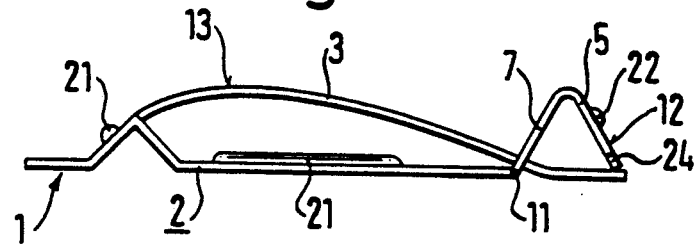
Figure 8:
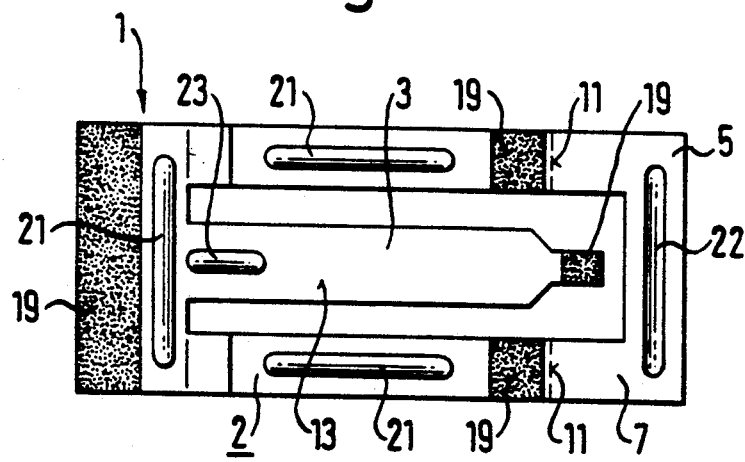
Figure 9:
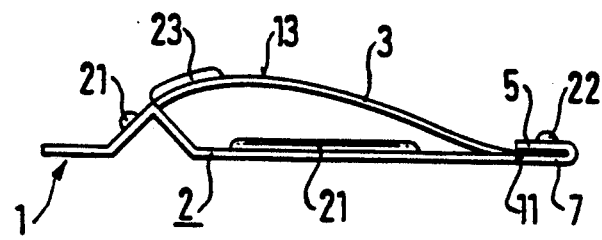

In the following the invention will now be described by way of example only, with the aid of embodiments and with reference to the drawings; these show:

FIG. 1 a perspective representation of a thermal overload fuse in accordance with the invention in its relaxed state, FIG. 2 a thermal overload fuse in accordance with FIG. 1 and in accordance with the invention in its stressed state, FIG. 3 a thermal overload fuse in accordance with FIGS. 1 and 2 in a soldered-in state and after removal of the auxiliary web, FIG. 4 a plan view of the thermal overload fuse in accordance with FIG. 1 with additional stiffening elements, FIG. 5 a side view of the thermal overload fuse in accordance with FIG. 4, FIG. 6 a plan view of a further embodiment of a thermal overload fuse in accordance with the invention, FIG. 7 a side view of a thermal overload fuse in accordance with FIG. 6, FIG. 8 a plan of a third embodiment of a thermal overload fuse in accordance with the invention, and FIG. 9 a side view of the thermal overload fuse in accordance with FIG. 8.

FIG. 1 shows the basic construction of a thermal overload fuse 1 in the form of a stamped part, consisting of a frame part 2 having a free lying central tongue 3, wherein the frame part 2 is kinked in a knee-like fashion in the region of the shank of the central tongue 3, so that the central tongue 3 points obliquely upwards. The right-hand-side end part 5 of the frame part 2 forms an auxiliary web 7 which is detachable via two notch lines 11 and which comprises a tongue-shaped part 9.

The next assembly stage of the thermal overload fuse 1 is shown in FIG. 2. In this arrangement, the auxiliary web 7 is bent upward the tongue-shaped part 9 forward, so that the auxiliary web forms a support 12 which holds down the central tongue 3, so that the latter forms a pre-stressed spring arm 13. After the performance of this assembly stage the thermal overload fuse 1 is in a solderable state.

FIG. 3 shows the thermal overload fuse 1 in a soldered-in state. The thermal overload fuse 1 is soldered onto the contact locations 15 and 16 of a substrate 17 after breaking off of the auxiliary web 7 along the notch line 11. The thermal overload fuse 1 is soldered onto the contact locations 15 and 16 via the solder areas 19 which are shown in the figures as dark regions.

FIG. 4 shows a plan view of a thermal overload fuse 1 constructed in accordance with the invention and in accordance with FIGS. 1 to 3, in which the auxiliary web 7 is shown in a non-kinked state. In this embodiment parts of the frame part 2 which are not allowed to bend or kink are provided with stiffening elements 21, which, in particular, are constructed as stiffening grooves of an embossed form. The solder areas 19 via which the thermal overload fuse 1 is fixed to the substrate 17 are shown as dark regions as in FIG. 3.

FIG. 5 shows the solderable state of the thermal overload fuse 1 in accordance with FIG. 4. The auxiliary web 7 is bent upward and the tongue-shaped part 9 bent obliquely forwards, so that it forms the support 12 which holds down the spring arm 13 in the pre-stressed position.

By the holding down of the spring arm 13 by means of the auxiliary web 7, the thermal overload fuse 1 can be soldered to the contact locations 15 and 16 at the substrate 1 via the solder areas 19 by simple reflow soldering. After removal of the auxiliary web 7 along the notch lines 11 from the thermal overload fuse 1, fixation of the thermal overload fuse 1 to the substrate 17 is complete and the functionality provided.

Should, as a result of thermal overloading, such a high temperature come to pass at the contact location 16 that the solder at the contact location 16 is brought to melting, the stressed spring arm 13 shoots upwards into its relaxed position, thereby breaking the circuit otherwise closed by the thermal overload fuse.

If, for example, a layer resistance is applied to the back side of the contact location 16, or in its vicinity on the fuse side, the thermal load of this layer resistance can be monitored by the thermal overload fuse.

FIG. 6 shows a plan view of a further advantageous embodiment of a thermal overload fuse 1 constructed in accordance with the invention. In this arrangement, the auxiliary web 7 is constructed as a simple U-shaped end part 5 which has a centrally symmetrically disposed projection 24. Therein, the auxiliary web 7 is provided with a stiffening element 22 having an embossed form.

FIG. 7 shows the solderable state of the thermal overload fuse in accordance with FIG. 6. The auxiliary web is bent upward and the free end of the upwardly bent auxiliary web 7 is kinked downwards, so that it forms the support 12 which holds down the spring arm 13 in its pre-stressed position via the projection 24.

FIG. 8 shows a further embodiment of a thermal overload fuse 1 constructed in accordance with the invention having an auxiliary web 7 which is constructed in a U-shape. Therein, the spring arm 13 is provided with a stiffening element 23 of embossed form on its shank in order to prevent the spring arm 13 kinking at the shank.

FIG. 9 shows the solderable state of the thermal overload fuse 1 in accordance with FIG. 8 in which the auxiliary web 7 holds down the spring arm 13 in its pre-stressed position by complete bending over, i.e. by bending over through approximately 180°. Kinking at this particularly endangered location is prevented by the stiffening element 23 on the shank of the spring arm 13.

I claim:

1. Thermal overload fuse (1) for soldering to a circuit substrate (17) having at least one spring arm (13) which is solderable, under fixed pre-stress, to a contact location (16) of the substrate (17), characterised in that the spring arm (13), which is fixed to an at least substantially planar frame part (2), adopts, in its relaxed state, a position which is spaced in a perpendicular direction relative to the substrate (17), in particular relative to the contact location (16); and in that the free end of the spring arm (13) is held down by at least one auxiliary web (7) onto the substrate (17), in particular onto the contact location (16); and in that the auxiliary web (7) is detachable from the frame part (2) along a predetermined line.

2. Thermal overload fuse (1) as set forth in claim 1, characterised in that the frame part (2) is constructed as a rectangular frame part (2) with a free lying central tongue (3), wherein in the region of the shank of the central tongue (3), the frame part (2) is kinked in a knee-like fashion so that the central tongue (3) in its relaxed state points obliquely upwards, thereby forming the spring arm (13).

3. Thermal overload fuse (1) as set forth in claim 1, characterised in that the knee-like kink extends perpendicular relative to the longitudinal axis of the spring arm (13).

4. Thermal overload fuse (1) as set forth in claim 1, characterised in that the auxiliary web (7) holding down the spring arm (13) is arranged at the side of the frame part (2) facing towards the free end of the spring arm (13).

5. Thermal overload fuse (1) as set forth in claim 1, characterised in that the auxiliary web (7) holding down the spring arm (13) is formed from the end part (5) of the frame part (2) facing towards the free end of the spring arm (13).

6. Thermal overload fuse (1) as set forth in claim 5, characterised in that the end part (5) of the frame part (2) which faces towards the free end of the spring arm (13) is bent upwards and has a support (12) pointing towards the spring arm (13) which holds down the free end of the spring arm (13) so that said end is arranged in the plane of said frame.

7. Thermal overload fuse (1) as set forth in claim 6, characterised in that
   the free end of the upwardly bent end part (5) is bent downwards thereby forming the support (12) for the holding down of the spring arm (13).

8. Thermal overload fuse (1) as set forth in claim 6, characterised in that
   the upwardly bent end piece includes a tongue-shaped part (9) which is bent towards the spring arm (13) thereby forming the support (12) for the holding down of the spring arm (13).

9. Thermal overload fuse (1) as set forth in claim 5, characterised in that
   the end part (5) of the frame part (2) facing towards the free end of the spring arm (13) is bent round, in particularly by approximately 180°, so that it holds down the free end of the spring arm (13) so that the this end is arranged in the plane of said frame.

10. Thermal overload fuse (1) as set forth in one claim 1, characterised in that
    the auxiliary web (7) is connected with the thermal overload fuse (1) via a notch line (11) for the breaking off of the auxiliary web (7).

11. Thermal overload fuse (1) as set forth in claim 1, characterised in that
    the frame part (2), the spring arm (13) and the auxiliary web (7) are constructed as a unitary stamped or pressed part.

12. Thermal overload fuse (1) as set forth in claim 1, characterised in that
    those parts of the thermal overload fuse (1) which are not to be bent or kinked are provided with stiffening elements (21, 22, 23) in particular with stiffening grooves of an embossed form.

13. Thermal overload fuse (1) as set forth in claim 1, characterised in that
    the frame part (2), the spring arm (13) and the auxiliary web (7) are manufactured from spring bronze, in particular from galvanically nickelled and tinned spring bronze.

* * * * *